United States Patent [19]
Nishida et al.

[11] 3,890,241
[45]* June 17, 1975

[54] PIEZOELECTRIC CERAMIC COMPOSITIONS

[75] Inventors: Masamitsu Nishida; Hiromu Ouchi, both of Osaka, Japan

[73] Assignee: Matsushita Electric Industrial Co., Ltd., Japan

[ * ] Notice: The portion of the term of this patent subsequent to Aug. 20, 1991, has been disclaimed.

[22] Filed: Sept. 5, 1973

[21] Appl. No.: 394,465

Related U.S. Application Data

[63] Continuation-in-part of Ser. No. 242,250, April 7, 1972, abandoned.

[30] Foreign Application Priority Data

Apr. 20, 1971 Japan ............................... 46-25865

[52] U.S. Cl. ............................................. 252/62.9
[51] Int. Cl. ...................... C04b 35/46; C04b 35/48
[58] Field of Search .................................. 252/62.9

[56] References Cited

UNITED STATES PATENTS

| | | | |
|---|---|---|---|
| 3,528,918 | 9/1970 | Nishida et al. | 252/62.9 |
| 3,594,321 | 7/1971 | Ohno et al. | 252/62.9 |
| 3,637,506 | 1/1972 | Tanizake et al. | 252/62.9 |

FOREIGN PATENTS OR APPLICATIONS

| | | | |
|---|---|---|---|
| 1,210,729 | 10/1970 | United Kingdom | 252/62.9 |

*Primary Examiner*—Jack Cooper
*Attorney, Agent, or Firm*—Wenderoth, Lind and Ponack

[57] ABSTRACT

Piezoelectric ceramic compositions having very high mechanical quality factors, high electromechanical coupling coefficients and high durabilities of the piezoelectric constants with cycling of mechanical impact, and comprising the quaternary system $Pb(Zn_{1/3}Nb_{2/3})O_3$-$Pb(Sn_{1/3}Nb_{2/3})O_3$-$PbTiO_3$-$PbZrO_3$ and containing a quantity of manganese equivalent to from 0.05 to 5 weight % of $MnO_2$.

4 Claims, No Drawings

PIEZOELECTRIC CERAMIC COMPOSITIONS

This is a continuation-in-part of Ser. No. 242,250 filed Apr. 7, 1972, now abandoned.

BACKGROUND OF THE INVENTION

This invention relates to piezoelectric ceramic compositions and articles of manufacture fabricated therefrom. More particularly, the present invention pertains to novel ferroelectric ceramics which are polycrystalline aggregates of certain constituents. These piezoelectric compositions are sintered into ceramics by ordinary ceramic techniques and thereafter the ceramics are polarized by applying a D.C. voltage between electrodes to impart thereto electromechanical transducing properties similar to the well known piezoelectric effect. The invention also encompasses the calcined intermediate product of raw ingredients and the articles of manufacture such as electromechanical transducers fabricated from the sintered ceramic.

The use of piezoelectric materials in various transducer applications in the production, measurement and sensing of sound, shock, vibration, pressure, and high voltage generation, etc., have increased greatly in recent years. Both crystal and ceramic types of transducers have been widely used. But, because of their potentially lower cost and ease of use in the fabrication of ceramics of various shapes and sizes and their greater durability at high temperatures and/or high humidities than crystalline substances such as Rochelle salt, etc., piezoelectric ceramic materials have recently come into prominent use in various transducer applications.

The piezoelectric characteristics required of ceramics apparently vary depending upon the intended application. For example, electromechanical transducers such as phonograph pick-up and microphone elements require piezoelectric ceramics characterized by a substantially high electromechanical coupling coefficient and dielectric constant. On the other hand, in the ceramic filter and piezoelectric transformer applications of piezoelectric ceramics it is desirable that the materials exhibit a higher value of mechanical quality factor and a high electromechanical coupling coefficient. Furthermore, ceramic materials require a high stability in dielectric constant and in other electrical properties over wide temperature and time ranges. Also, electromechanical transducers such as a ceramic ignitor element applied as a spark source for gas require piezoelectric ceramics characterized by high piezoelectricity, high mechanical strength and great durability of output voltage with cycling of mechanical stress.

As a promising ceramic for these applications, lead titanate-lead zirconate has been in wide use up to now. However, it is difficult to obtain a very high mechanical quality factor along with a high planar coupling coefficient in the conventional lead titanate-lead zirconate ceramics. Moreover, the dielectric and piezoelectric properties of the lead titanate-lead zirconate ceramics vary greatly depending upon the firing technique employed due to the evaporation of PbO. Improvement of these factors has been made by incorporating various additional constituents into the basic ceramic composition or by incorporating various complex compounds. For example, U.S. Pat. No. 2,911,370 relates to lead titanate zirconate ceramics modified with $Nb_2O_5$, $Ta_2O_5$ and $Y_2O_3$, etc., and U.S. Pat. No. 3,403,103 relates to ternary system $PbZn_{1/3}Nb_{2/3}O_3$-$PbTiO_3$-$PbZrO_3$ ceramics. These ceramics exhibit high electromechanical coupling coefficients but exhibit low mechanical quality factors and low durabilities of the piezoelectric constants with mechanical stress.

OBJECTS AND SUMMARY OF THE INVENTION

It is, therefore, the fundamental object of the present invention to provide novel and improved piezoelectric ceramic materials which overcome the problems outlined above. A specific object of the invention is to provide improved polycrystalline ceramics characterized by very high mechanical quality factors along with high piezoelectric coupling coefficients.

A more specific object of the invention is the provision of novel piezoelectric ceramics characterized by very high mechanical quality factors, high electromechanical coupling coefficients, and highly stable dielectric constants over wide temperature and time ranges.

Another object of the invention is the provision of novel piezoelectric ceramics characterized by great durability of output voltage with cycling of mechanical impact on a ceramic ignitor element applied as a spark source for gas.

Still another object of the invention is the provision of novel piezoelectric ceramics characterized by high mechanical strength.

A further object of the invention is the provision of novel piezoelectric ceramic compositions, certain properties of which can be varied to suit various applications.

A still further object of the invention is the provision of improved electromechanical transducers utilizing, as the active elements, electrostatically polarized bidies composed of these novel ceramic compositions.

These objects are achieved by providing ceramic bodies which exist basically in the solid solution comprising the quaternary system $Pb(Zn_{1/3}Nb_{2/3})O_3$-$Pb(Sn_{1/3}Nb_{2/3})O_3$-$PbTiO_3$-$PbZrO_3$ modified with $MnO_2$.

DETAILED DESCRIPTION OF THE INVENTION

The present invention is based on the discovery that within certain particular compositional ranges of this system the specimens exhibit very high mechanical quality factors, high electromechanical coupling coefficients and high durability of the piezoelectric constant with mechanical stress.

The ceramic compositions of the present invention have various advantages in the processes for their manufacture and in their application for ceramic transducers. It has been known that the evaporation of PbO during firing is a problem encountered in the sintering of lead compounds such as lead titanate-zirconate. The compositions of the invention evidence a smaller amount of evaporated PbO than the usual lead titanate-zirconates upon firing. The quaternary system can be fired in the absence of a PbO atmosphere. A well sintered body according to the present composition is obtained by firing the above described compositions in a ceramic crucible covered with a ceramic cover made of $Al_2O_3$ ceramics. A high sintered density is desirable for resistance to humidity and high piezoelectric response when the sintered body is utilized as a resonator and for other applications.

Some compositions coming within the quaternary system $Pb(Zn_{1/3}Nb_{2/3})O_3$-$Pb(Sn_{1/3}Nb_{2/3})O_3$-$PbTiO_3$-$PbZrO_3$ do not exhibit high piezoelectricity, and many are electromechanically active only to a slight degree. The present invention is concerned with the compositions represented by the formula $Pb(Zn_{1/3}Nb_{2/3})_A(Sn_{1/3}Nb_{2/3})_BTi_CZr_DO_3$, wherein the ranges for A, B, C, and D are $0.01 \leqq A \leqq 0.50$, $0.01 \leqq B \leqq 0.25$, $0.25 \leqq C \leqq 0.625$, $0.20 \leqq D \leqq 0.625$, and wherein $A+B+C+D=1$, and exhibiting piezoelectric response of appreciable magnitude. The compositions of the present invention comprise the basic compositions of above discription and additive of $MnO_2$.

The compositions described herein may be prepared in accordance with various well-known ceramic procedures. A preferred method, however, hereinafter more fully described, contemplates the use of PbO or $Pb_3O_4$, ZnO, $SnO_2$, $Nb_2O_5$, $TiO_2$, $ZrO_2$, and $MnO_2$ or $MnCO_3$ as starting materials.

EXAMPLE 1

The starting materials, vis, lead oxide (PbO), zinc oxide (ZnO), stannic oxide ($SnO_2$), niobia ($Nb_2O_5$), titania ($TiO_2$), zirconia ($ZrO_2$) and manganese dioxide ($MnO_2$) all of relatively pure grade (e.g., C.P. grade) are intimately mixed in a rubber-lined ball mill with distilled water. In milling the mixture care should be exercised to avoid contamination thereof due to wear of the milling ball or stones. This may be avoided by varying the proportions of the starting materials to compensate for any contamination.

Following the wet milling, the mixture is dried and mixed to insure as homogeneous a mixture as possible. Thereafter, the mixture is suitably formed into desired forms at a pressure of 400 $Kg/cm^2$. The compacts are then pre-reacted by a calcination at a temperature of about 850°C for about 2 hours.

After calcination, the reacted material is allowed to cool and is then wet milled to a small particle size. $MnO_2$ may be added to the reacted material after calcination of raw materials which did not include $MnO_2$, and then the reacted material with $MnO_2$ may be milled to a small particle size. Once again, care should be exercised as above to avoid contamination by wear of the milling balls or stones. Depending on preference and the shapes desired, the material may be formed into a mix or slip suitable for pressing, slip casting, or extruding, as the case may be, in accordance with conventional ceramic forming procedures. The mix was then pressed into discs of 20 mm diameter and 2 mm thickness at a pressure of 700 $Kg/cm^2$. The pressed discs were fired at 1,200°–1310°C for 45 minutes. According to the present invention, there is no need to fire the composition in an atmosphere of PbO. Moreover, there is no need to maintain a special temperature gradient in the firing furnace as is necessary in prior art procedures. Thus, according to the present invention, uniform and excellent piezoelectric ceramic products can be easily obtained simply by covering the samples with an alumina crucible during firing.

The sintered ceramics were polished on both surface to a thickness of 1 millimeter. The polished disc surfaces were then coated with silver paint and fired to form silver electrodes. Finally, the discs were polarized while immersed in a bath of silicone oil at 100°–150°C. A voltage gradient of D.C. 3–4 KV per mm was maintained for 1 hour, and the disc field-cooled to room temperature in 30 minutes.

The piezoelectric and dielectric properties of the polarized specimen were measured at 20°C in a relative humidity of 50% and at a frequency of 1 Kc. Examples of specific ceramic compositions according to this invention and various pertinent electromechanical properties, dielectric properties and mechanical property thereof are given in Table 1.

Table I

| Ex. No. | Compositions: Basic Compositions | Compositions: Weight Percent of $MnO_2$ Additive | Dielectric Constant $\epsilon$ | Planar Coupling Coefficient Kp | Mechanical Quality Factor $Q_M$ | Bending Strength ($Kg/cm^2$) | $\epsilon$-T.C. (%) |
|---|---|---|---|---|---|---|---|
| 1 | $Pb(Zn_{1/3}Nb_{2/3})_{0.01}(Sn_{1/3}Nb_{2/3})_{0.11}Ti_{0.44}Zr_{0.44}O_3$ | 0.3 | 1020 | 0.63 | 2070 | 1290 | 10.1 |
| 2 | $Pb(Zn_{1/3}Nb_{2/3})_{0.06}(Sn_{1/3}Nb_{2/3})_{0.06}Ti_{0.43}Zr_{0.45}O_3$ | 0.5 | 1110 | 0.65 | 2640 | 1410 | 9.3 |
| 3 | $Pb(Zn_{1/3}Nb_{2/3})_{0.11}(Sn_{1/3}Nb_{2/3})_{0.01}Ti_{0.44}Zr_{0.44}O_3$ | 1.0 | 1250 | 0.62 | 2430 | 1350 | 10.9 |
| 4 | $Pb(Zn_{1/3}Nb_{2/3})_{0.20}(Sn_{1/3}Nb_{2/3})_{0.05}Ti_{0.38}Zr_{0.37}O_3$ | 0.5 | 1190 | 0.62 | 2580 | 1340 | 9.5 |

$\epsilon$-T.C. is the change in dielectric constant within the range 20 – 70°C.

From Table I it will be readily evident that all exemplary compositions are characterized by very high mechanical quality factors and high planar coupling coefficients, all of which properties are important for the use of piezoelectric compositions in ceramic filters, piezoelectric transformers and ultra-sonic transducer applications. From Table I it will be obvious that the compositions according to the invention exhibit high mechanical strengths and small changes of dielectric constant with temperature.

These properties are important to the use of piezoelectric compositions in piezoelectric transformer and filter applications, etc. The term piezoelectric transformer is here employed to describe a passive electrical energy transfer device or transducer employing the piezoelectric properties of the material of which they are constructed to achieve a transformation of voltage, current or impedance. It is desirable in this application of the ceramics that the piezoelectric materials exhibit a highly stable dielectric constant over a wide temperature range and exhibit very high mechanical quality factors and high electromechanical coupling coefficients in order that the piezoelectric transformer utilized in a T.V. set, etc., exhibits a high stability with temperature in output voltage and current. It is desirable in these applications of the ceramics that the piezoelectric ceramics exhibit a high mechanical strength in order that products employing the ceramics exhibit high reliability over wide time ranges and in high mechanical stress.

Piezoelectric transformer units comprising the composition of example No. 2 exhibited very low power loss (0.5 watt at 1.5 watt of output, DC 10KV of output voltage, and 56mm in length of element) as compared with conventional ones. On the other hand, power loss of piezoelectric transformer units comprising a conventional ceramics ($PbZn_{1/3}Nb_{2/3}O_3$-$PbTiO_3$-$PbZrO_3$ modified with $MnO_2$) were about 1 watt at the same condition as above.

EXAMPLE 2

The reacted powder prepared by the same method as Example 1 was pressed into columns 10 mm in diameter and 20 mm in length at a pressure of 700 kg/cm$^2$. The pressed columns were fired at 1,200°–1,310°C for 45 minutes. The sintered ceramics were polished to form columns 7 mm in diameter and 15mm in length. Both sides of the polished columns were then coated with silver paint and fired to form silver electrodes. The columns were polarized while immersed in a bath of silicone oil at 100°–150°C. A voltage gradient of D.C. 2–3 KV per mm was maintained for 30 minutes. Examples of specific ceramic compositions according to this invention and pertinent electromechanical properties are given in Table II. From Table II it will be evident that all exemplary compositions of the present invention are characterized by high durability of the piezoelectric constant with cycling of mechanical impact. And, the ceramics of this invention exhibit great durability of output voltage with cycling of mechanical impact on a ceramic ignitor element applied as a spark source for gas. Example No. 9 is the one of conventional compositions.

This property is important to the use of piezoelectric ceramics as ceramic ignitors, etc.

The piezoelectric constant after impact was measured after $10^7$ times of mechanical impacts at a pressure of 400 kg/cm$^2$.

The change of output voltage shows the change of output voltage of the ceramic ignitor unit having the composition of the present invention between before impact and after $3\times10^4$ times of mechanical impact of a pressure generating output voltage of 15 KV at starting point of cycling test.

Table II

| | Compositions | | Piezoelectric Constant $g_{33}\times10^3$, V.m/N | | Change of Output Voltage, % |
|---|---|---|---|---|---|
| | Basic Compositions | Weight Percent of $MnO_2$ Additive | Before Impact | After Impact | |
| 5 | $Pb(Zn_{1/3}Nb_{2/3})_{0.03}(Sn_{1/3}Nb_{2/3})_{0.06}Ti_{0.45}Zr_{0.46}O_3$ | 0.1 | 28.6 | 27.4 | 1.6 |
| 6 | $Pb(Zn_{1/3}Nb_{2/3})_{0.06}(Sn_{1/3}Nb_{2/3})_{0.06}Ti_{0.44}Zr_{0.44}O_3$ | 0.5 | 28.8 | 27.5 | 1.3 |
| 7 | $Pb(Zn_{1/3}Nb_{2/3})_{0.06}(Sn_{1/3}Nb_{2/3})_{0.09}Ti_{0.42}Zr_{0.43}O_3$ | 0.2 | 29.1 | 27.6 | 1.8 |
| 8 | $Pb(Zn_{1/3}Nb_{2/3})_{0.09}(Sn_{1/3}Nb_{2/3})_{0.09}Ti_{0.42}Zr_{0.40}O_3$ | 0.2 | 28.5 | 27.0 | 2.0 |
| 9 | $Pb_{0.9}Sr_{0.1}Ti_{0.46}Zr_{0.54}O_3$ | | 23.0 | 19.2 | 15.3 |

EXAMPLE 3

Tested specimen were prepared by the same method as Example 1. The piezoelectric, dielectric and mechanical properties of the specimen were measured by the same method as Example 1. Measured properties of the specimen are given in Table III.

From Table III it will be evident that according to the present invention, piezoelectric and dielectric properties of the ceramic can be adjusted to suit various applications by selecting the proper composition, and that all exemplary compositions of the present invention are characterized by very high mechanical quality factor and high mechanical strength. Therefore, the piezoelectric ceramic compositions of the present invention are suitable for the application of electromechanical transducer elements such as ceramic filters etc.

In ceramic compositions containing $MnO_2$ additive in amounts more than 5 weight %, $Q_M$ and Kp of the ceramics are relatively low. Ceramic compositions containing an amount of $MnO_2$ aditive less than 0.05 weight % exhibit low $Q_M$. For these reasons they are excluded from the scope of the present invention.

In addition to the superior properties shown above, compositions according to the present invention yield ceramics of good physical quality and which polarize well. It will be understood from the foregoing that the quaternary system $Pb(Zn_{1/3}Nb_{2/3})O_3$-$Pb(Sn_{1/3}Nb_{2/3})O_3$-$PbTiO_3$-$PbZrO_3$ modified with $MnO_2$ form excellent piezoelectric ceramic bodies.

It will be evident that the starting materials to be used in this invention are not limited to those used in the above examples. Those oxides may be used, in place of the starting materials of the above examples, which are easily decomposed at elevated temperatures to form the required compositions.

While there have been described what at present are believed to be the preferred embodiments of this invention, it will be obvious that various changes and modifications can be made therein without departing from the spirit or scope of the invention.

What is claimed is:

1. A piezoelectric ceramic composition consisting es-

Table III

| Example No. | Compositions | | Dielectric Constant $\epsilon$ | Planar Coupling Coefficient Kp | Mechanical Quality Factor $Q_M$ | Bending Strength (Kg/cm$^2$) |
|---|---|---|---|---|---|---|
| | Basic Compositions | Weight Percent of $MnO_2$ Additive | | | | |
| 10 | $Pb(Zn_{1/3}Nb_{2/3})_{0.075}(Sn_{1/3}Nb_{2/3})_{0.05}Ti_{0.25}Zr_{0.625}O_3$ | 1.0 | 530 | 0.35 | 2690 | 1370 |
| 11 | $Pb(Zn_{1/3}Nb_{2/3})_{0.075}(Sn_{1/3}Nb_{2/3})_{0.05}Ti_{0.625}Zr_{0.25}O_3$ | 2.0 | 520 | 0.30 | 2730 | 1310 |
| 12 | $Pb(Zn_{1/3}Nb_{2/3})_{0.25}(Sn_{1/3}Nb_{2/3})_{0.10}Ti_{0.30}Zr_{0.35}O_3$ | 0.1 | 1140 | 0.34 | 1050 | 1300 |
| 13 | Same as above | 1.0 | 1090 | 0.37 | 3120 | 1410 |
| 14 | do. | 5.0 | 950 | 0.33 | 1460 | 1290 |
| 15 | $Pb(Zn_{1/3}Nb_{2/3})_{0.05})_{0.05}(Sn_{1/3}Nb_{2/3})_{0.25}Ti_{0.35}Zr_{0.35}O_3$ | 0.5 | 910 | 0.51 | 2340 | 1350 |
| 16 | $Pb(Zn_{1/3}Nb_{2/3})_{0.50}(Sn_{1/3}Nb_{2/3})_{0.05}Ti_{0.25}Zr_{0.20}O_3$ | 0.5 | 970 | 0.25 | 2570 | 1270 |

sentially of a material represented by the formula:

$$Pb(Zn_{1/3}Nb_{2/3})_A(Sn_{1/3}Nb_{2/3})_BTi_CZr_DO_3$$

wherein the range for A, B, C, and D are $0.01 \leqq A \leqq 0.50$, $0.01 \leqq B \leqq 0.25$, $0.25 \leqq C \leqq 0.625$, $0.20 \leqq D \leqq 0.625$, and wherein $A+B+C+D=1$, and further containing a quantity of manganese equivalent to from 0.05 to 5 weight percent of manganese dioxide ($MnO_2$).

2. An electromechanical transducer element comprising a ceramic composition as claimed in claim 1.

3. A piezoelectric ceramic composition consisting essentially of a material represented by the formula:

$$Pb(Zn_{1/3}Nb_{2/3})_{0.06}(Sn_{1/3}Nb_{2/3})0.06Ti_{0.43}Zr_{0.45}O_3,$$

and further containing a quantity of manganese equivalent to 0.5 weight percent of manganese dioxide ($MnO_2$).

4. An electromechanical transducer element comprising a piezoelectric ceramic composition as claimed in claim 3.

* * * * *